United States Patent
Chang et al.

(10) Patent No.: US 7,394,295 B2
(45) Date of Patent: Jul. 1, 2008

(54) SENSE AMPLIFIER

(75) Inventors: Chia-Pao Chang, Banciao (TW);
Chin-Sheng Lin, Tainan County (TW);
Keng-Li Su, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 67 days.

(21) Appl. No.: 11/515,882

(22) Filed: Sep. 6, 2006

(65) Prior Publication Data

US 2007/0170956 A1 Jul. 26, 2007

(30) Foreign Application Priority Data

Jan. 26, 2006 (TW) .............................. 95103055 A (51) Int. Cl.
*H03K 5/22* (2006.01)

(52) U.S. Cl. .............................. 327/58; 327/62; 327/66; 327/77; 327/78; 327/79; 327/80; 327/81; 327/51; 365/189; 365/205; 365/207; 365/208

(58) Field of Classification Search ....................... None
See application file for complete search history.

(56) References Cited

U.S. PATENT DOCUMENTS 6,762,953 B2   7/2004  Tanizaki et al. ............. 365/158
2006/0181314 A1*  8/2006  Teo et al. ....................... 327/77
2007/0085596 A1*  4/2007  Ito .............................. 327/534
2007/0176591 A1*  8/2007  Kimura ....................... 323/315
2008/0002481 A1*  1/2008  Gogi et al. ............. 365/189.06
2008/0007992 A1*  1/2008  Wang et al. ................. 365/158

* cited by examiner

*Primary Examiner*—Tuan T Lam
*Assistant Examiner*—Hiep Nguyen
(74) *Attorney, Agent, or Firm*—Birch, Stewart, Kolasch & Birch, LLP (57) ABSTRACT

The invention relates to a sense amplifier comprising the following element: a first current mirror unit coupled to a high voltage source, outputting a first current and a second current according to a first reference current, wherein the second current is twice the first current; a second current mirror unit coupled to a high voltage source, outputting a third current according to a second reference current; a first impedor coupled to the second current and a low voltage source; a second impedor coupled to the third current and a low voltage source; a third current mirror coupled to the first, second and third currents, and the first current is regarded as the reference current of the third current mirror unit, thus, the current which flows through the first impedor is the first current, and the current which flows through the second impedor is a fourth current.

24 Claims, 9 Drawing Sheets

SENSE AMPLIFIER

BACKGROUND OF THE INVENTION

1. Field of the Invention

The present invention relates to a sense amplifier, and more particularly to a sense amplifier with a larger sensing voltage range.

2. Description of the Related Art

Non-volatile memory is the major memory product can conserve data without requiring power over a long period of time. In Magnetoresistive Ram (MRAM) and Resistive Ram (RRAM) for example, the logic state of data stored therein is determined by the resistance thereof. Because the resistance of logic state 1 and 0 are different, a sense amplifier is applied to sense the current of the memory cell by applying a fixed voltage thereon, thus, the accuracy of determining the logic state of the data stored in memory depends on the performance of the sense amplifier. Furthermore, the reading speed of memory is relevant to the performance of the sense amplifier. The shorter reading time is desirable and the reading time is also relevant to the current passing through the memory cell.

Figure 1:
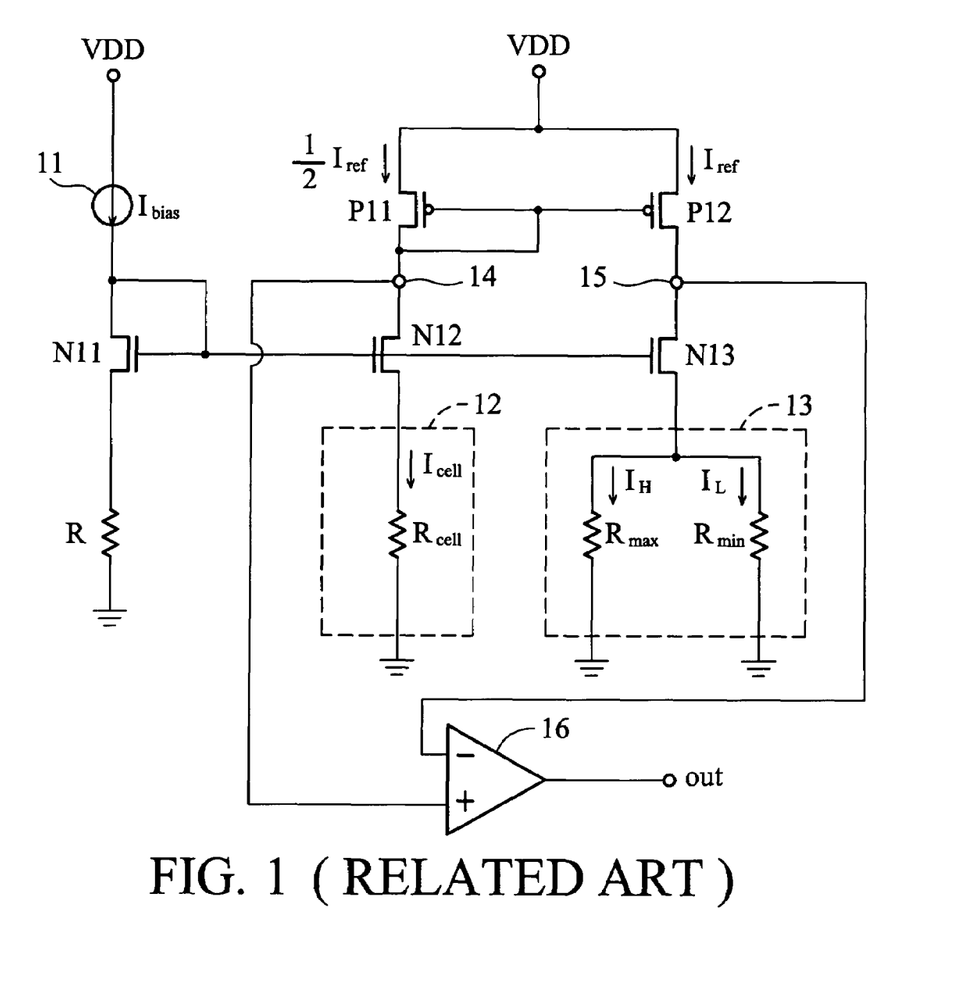
FIG. 1 is a circuit diagram of a conventional sense amplifier.

FIG. 1 is a circuit diagram of a conventional sense amplifier. Control current source 11 is coupled to a high voltage source VDD and the drain and the gate of transistor N11. Resistor R is coupled to the source of transistor N11 and a ground. Transistor P11 has a source, a drain and a gate, wherein the source is coupled to the high voltage source VDD, the gate is coupled to the gate of transistor P12 and the drain is coupled to the drain of transistor N12. Transistor P12 has a source, a drain and a gate, wherein the source is coupled to the high voltage source VDD and the drain is coupled to the drain of transistor N13. The gate of transistor N13 is coupled to the gate of transistor N12. Memory Cell 12 is coupled to the source of transistor N12 and ground. Reference memory cell 13 is coupled to the source of transistor N13 and ground. Memory cell 12 has an equivalent resistance $R_{cell}$ and when a predetermined voltage is applied to the memory cell 12, the current of the memory cell 12 is $I_{cell}$. The reference memory cell 13 has two parallel resistors $R_{max}$ and $R_{min}$, and when the predetermined voltage is applied to the reference memory cell 13, the current of $R_{max}$ is $I_H$ and the current of $R_{min}$ is $I_L$. Control current 11 outputs a control current $I_{bias}$ which utilizes the different W/L values of transistors P11 and P12 (In FIG. 1, the W/L value of the transistor P12 is twice the W/L value of the transistor P11) to control the current flowing in through the transistor P12 to be $I_{ref}$ and the current flowing in through the transistor P11 to be $$\frac{1}{2}I_{ref}.$$

Resistors $R_{max}$ and $R_{min}$ respectively have resistance when the data stored in memory cell 12 stores is logic 1 or logic 0, and when the predetermined voltage is applied to the memory cell 12, the current passing through the memory cell 12 is respectively the current $I_H$ or $I_L$. In FIG. 1, the data stored in memory cell 12 is determined by applying the predetermined voltage to the memory cell 12 to make the memory cell current $I_{cell}$ be $I_H$ or $I_L$, thus a differential voltage between node 14 and 15 is generated and a comparator 16 receives the differential voltage to determine what data is stored in the memory cell 12. In FIG. 1, the reference current $I_{ref}$ is the sum of $I_H$ and $I_L$, thus a half divider circuit is required and the layout area of the sense amplifier is increased. Moreover, the difference between the memory cell current $I_{cell}$ and the reference current $I_{ref}$ is not easily determined, thus, the speed and accuracy of the sense amplifier suffers. In FIG. 1, the current sensing range is $$\frac{1}{2}(I_L - I_H)$$

or $$\frac{1}{2}(I_H - I_L)$$

and if the difference between $I_H$ and $I_L$ is not easily determined, the sense amplifier of FIG. 1 may be not sensitive enough and easily affected by noise.

Figure 2:
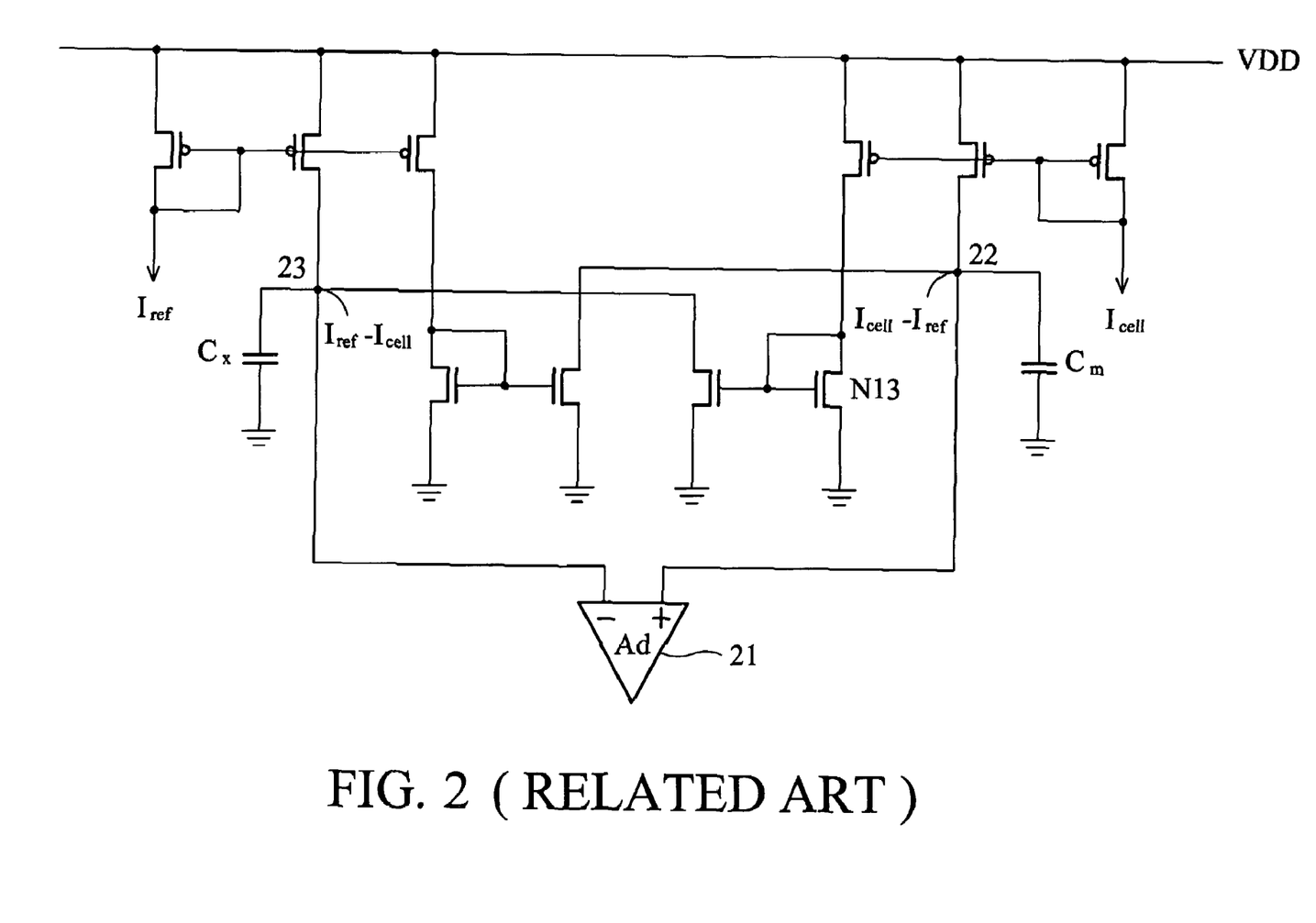
FIG. 2 is a circuit diagram of a sense amplifier disclosed in U.S. Pat. No. 6,762,953.

FIG. 2 is a circuit diagram of a conventional sense amplifier of U.S. Pat. No. 6,762,953. In FIG. 2, the outputs 22 and 23 of comparator 21 respectively receives current ($I_{ref}-I_{cell}$) and current ($I_{cell}-I_{ref}$), thus the current sensing range is larger than the current sensing range of the sense amplifier of FIG. 1 (In FIG. 1, the current sensing range is $I_{ref}-I_{cell}$). The reference current $I_{ref}$ of FIG. 2 is $$\frac{1}{2}(I_H + I_L),$$

however, thus a half divider circuit is required or the current mirror of the sense amplifier of FIG. 2 is utilized to output half of the current $I_H$ and $I_L$. Although the current sensing range of FIG. 2 is twice the current sensing range of the sense amplifier of FIG. 1, the sense amplifier of FIG. 2 requires more transistors and greater layout area. Thus, a sense amplifier with a larger voltage sensing range and simple circuit design is desirable.

BRIEF SUMMARY OF THE INVENTION

The invention provides a sense amplifier coupled to a memory cell, comprising a first current mirror unit, a second current mirror unit, a first impedor, a second impedor and a third current mirror unit. The first current mirror unit coupled to a high voltage source outputs a first current via a first output and a second current via a second output based on a first reference current, wherein the first current is equal to the first reference current and the second current is two times the first current. The second current mirror unit coupled to the high voltage source outputs a reference current via a third output based on a second reference current, wherein the reference current is equal to the second reference current. The first impedor coupled to the second output and a low voltage source has a first impedance. The second impedor coupled to the third output and the low voltage source has the first impedance. The third current mirror unit coupled to the first output, the second output and the third output, takes the first current as a third reference current of the third current mirror to make the current passing through the first impedor equal to the first current and the current passing through the second impedor to be equal to the fourth current.

The invention provides a sense amplifier coupled to a memory cell comprising a first impedor coupled to a low voltage source; a second impedor coupled to the low voltage source; a memory cell current source coupled to the low voltage source for providing a first current; a reference memory cell current source coupled to the low voltage source for providing a reference current; a first transistor having a first source, a first drain and a first gate, wherein the first source is coupled to the high voltage source, the first drain and the first gate are coupled to the memory cell current source; a second transistor having a second source, a second drain and a second gate, wherein the second source is coupled to the high voltage source, the second gate is coupled to the first gate and the second drain is coupled to the first impedor and the third current unit; a third transistor having a third source, a third drain and a third gate, wherein the third source is coupled to the high voltage source and the third gate is coupled to the first gate; a fourth transistor having a fourth source, a fourth drain and a fourth gate, wherein the fourth source is coupled to the high voltage source and the fourth drain is coupled to the second impedor; a fifth transistor having a fifth source, a fifth drain and a fifth gate, wherein the fifth source is coupled to the high voltage source, the fifth gate is coupled the fourth gate and the fifth drain and the fifth drain is coupled to the reference memory cell current source; a sixth transistor having a sixth source, a sixth drain and a sixth gate, wherein the sixth source is coupled to the low voltage source and the sixth drain is coupled to the first impedor and the second drain; a seventh transistor having a seventh source, a seventh drain and a seventh gate, wherein the seventh source is coupled to the low voltage source and the seventh drain is coupled to the third drain, the seventh gate and the sixth gate; a eighth transistor having a eighth source, a eighth drain and a eighth gate, wherein the eighth source is coupled to the low voltage source, the eighth gate is coupled to the seventh gate and the eighth drain is coupled to the second impedor and the fourth drain.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
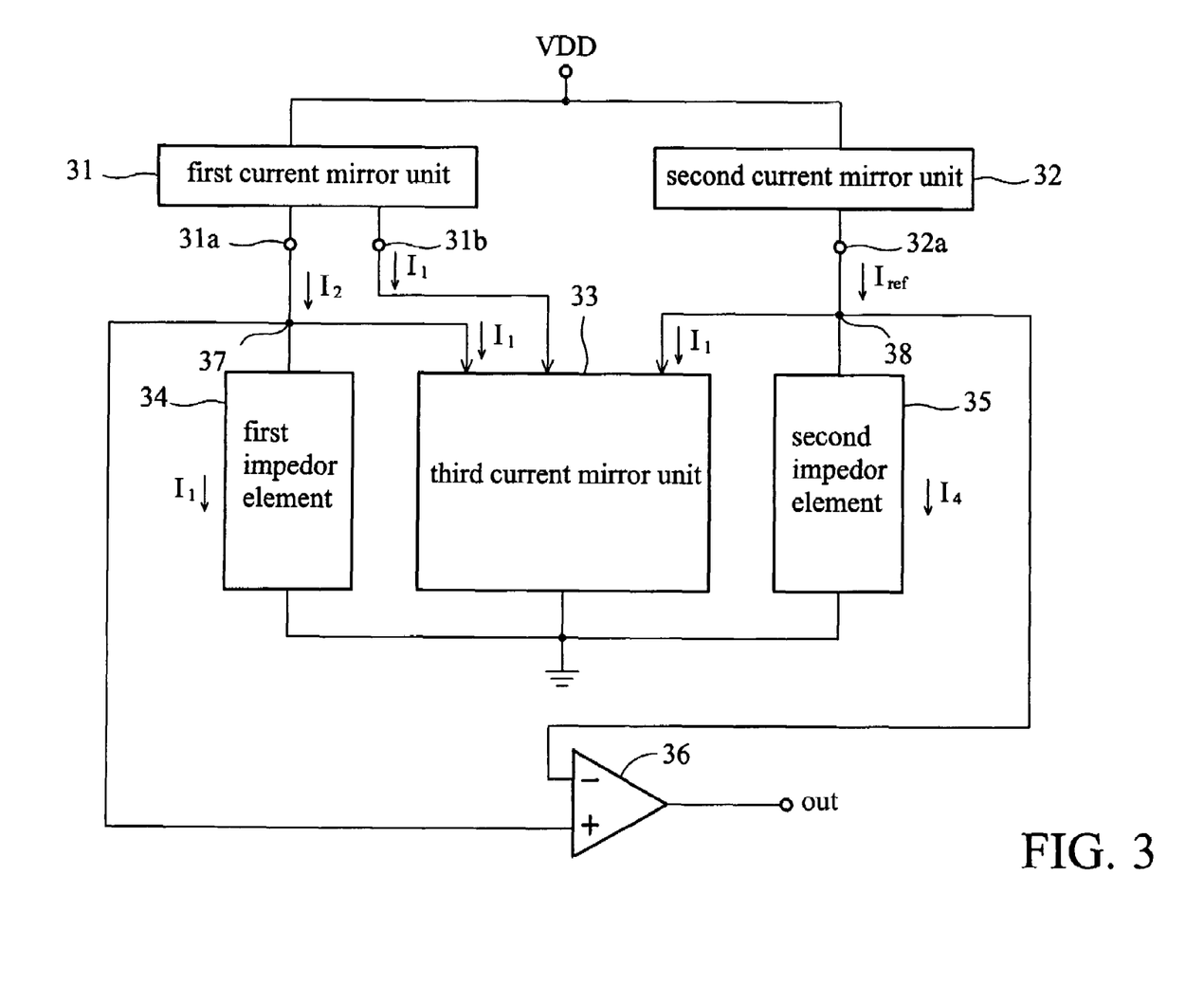
FIG. 3 is a schematic diagram of an embodiment of a sense amplifier of the invention.

FIG. 3 is a schematic diagram of an embodiment of a sense amplifier of the invention. The first current mirror unit 31 coupled to a high voltage source VDD has a first output 31a and a second output 31b, and outputs a current $I_1$ via the second output 31b and a current $I_2$ via the first output 31a based on a current source (not shown in FIG. 3), wherein $I_2$ is twice of $I_1$. The second current mirror 32 coupled to the high voltage source has a output 32a and outputs a current $I_{ref}$ via the output 32a based on a reference current source (not shown in FIG. 3). The third current mirror 33 coupled to the first output 31a, second output 31b, output 32a and ground takes the current $I_1$ as the reference of the third current mirror 33. The first impedor 34 coupled to the first output 31a and ground has impedance $Z_1$. The second impedor 35 coupled to the output 32a and ground has impedance $Z_2$. Since the third current mirror 33 takes the current I1 as the reference current and the currents input to third current mirror 33 from the first output 31a and the output 32a are also the current $I_1$, thus the current passing through the first impedor 34 is current $I_1$ and the current passing through the second impedor is $(I_{ref}-I_1)$.

In this embodiment, the current $I_1$ is acquired by applying a predetermined voltage on a memory cell. When the data stored by the memory cell is logic 1, the current $I_1$ is $I_H$ and when the data stored by the memory cell is logic 1, the current $I_1$ is $I_L$. In this embodiment, the reference current $I_{ref}$ is $(I_H+I_L)$. When the data stored by the memory cell is logic 1, the current $I_1$ is $I_H$ and the current passing through the second impedor is $I_L$, thus, the voltage of the node 37 is $(I_H \times Z_1)$ and the voltage of node 38 is $(I_L \times Z_2)$. The comparator 36 outputs a voltage difference $(I_H \times Z_1 - I_L \times Z_2)$ based on the voltages of nodes 37 and 38, and when the impedance $Z_1$ is equal to $Z_2$, the voltage difference is $(I_H - I_L) \times Z_1$.

Figure 4:
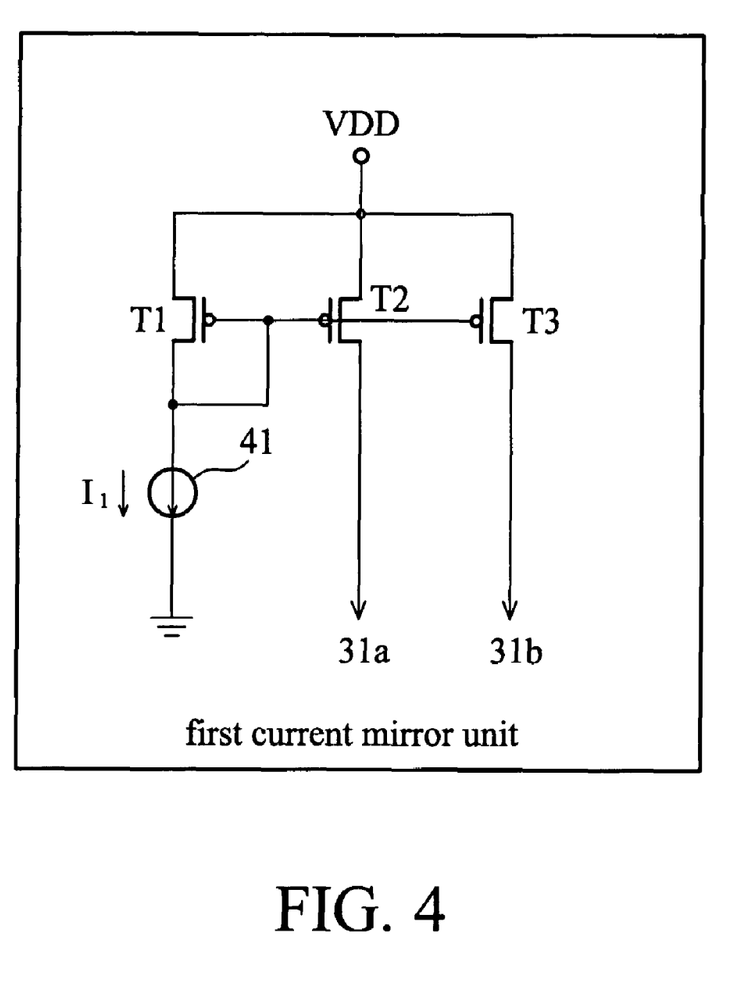
FIG. 4 is a circuit diagram of an embodiment of the first current mirror 31 of FIG. 3 of the invention.

FIG. 4 is a circuit diagram of an embodiment of the first current mirror 31 of FIG. 3 of the invention. PMOS transistor T1 has a first source, a first drain and a first gate, wherein the first source is coupled to the high voltage source VDD and the first gate and first drain are coupled to a memory cell source 41 for generating the memory cell current $I_1$. PMOS transistor T2 has a second source, a second drain and a second gate, wherein the second source is coupled to the high voltage source VDD, the second gate is coupled to the first gate and the second drain is coupled to the first output 31a. PMOS transistor T3 has a third source, a third drain and a third gate, wherein the third source is coupled to the high voltage source VDD, the third gate is coupled to the first gate and the third drain is coupled to the second output 31b. In FIG. 4, the W/L of the transistor T2 is twice the W/L of the transistor T3, thus the current passing through the transistor T2 is twice the current passing through the transistor T3.

Figure 5:
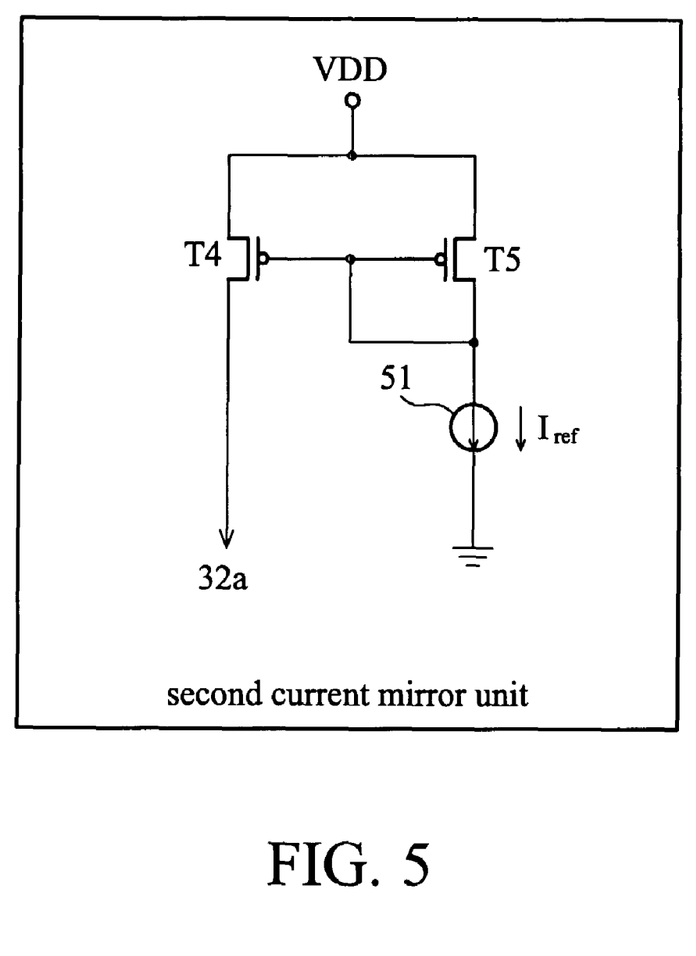
FIG. 5 is a circuit diagram of an embodiment of the second current mirror 32 of FIG. 3 of the invention.

FIG. 5 is a circuit diagram of an embodiment of the second current mirror 32 of FIG. 3 of the invention. PMOS transistor T4 has a fourth source, a fourth drain and a fourth gate, wherein the fourth source is coupled to the high voltage source VDD and the fourth drain is coupled to the output 32a. PMOS transistor T5 has a fifth source, a fifth drain and a fifth gate, wherein the fifth source is coupled to the high voltage source VDD, the fifth drain and fifth gate are coupled to the fourth gate and a reference memory cell current source 51 generating the reference current $I_{ref}$. In FIG. 5, the W/L of the transistor T4 is equal to the W/L of the transistor T5, thus, the output 32a outputs the reference current $I_{ref}$.

Figure 6:
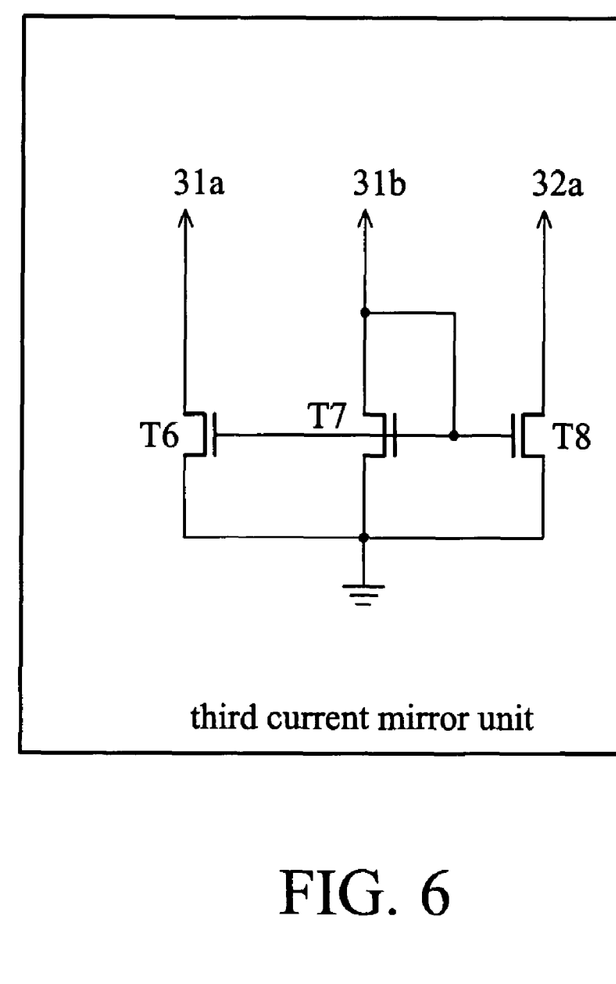
FIG. 6 is a circuit diagram of an embodiment of the third current mirror 33 of FIG. 3 of the invention.

FIG. 6 is a circuit diagram of an embodiment of the third current mirror 33 of FIG. 3 of the invention. NMOS transistor T7 has a seventh source, a seventh drain and a seventh gate, wherein the seventh source and the seventh gate are coupled to the second output 31b for receiving the current $I_1$ and the seventh drain is coupled to ground. In the third current mirror 33, the current passing through the transistor T7, $I_1$, is taken as the reference current source of the third current mirror 33. NMOS transistor T6 has a sixth source, a sixth drain and a sixth gate, wherein the sixth source is coupled to ground, the sixth drain is coupled to the first output 31a and the sixth gate is coupled to the seventh gate. NMOS transistor T8 has a eighth source, a eighth drain and a eighth gate, wherein the eighth drain is coupled to 32a, the eighth gate is coupled to the seventh gate and the eighth source is coupled to ground. In FIG. 6, the W/L values of transistors T6, T7 and T8 are the same, thus, the current passing through the first impedor 34 is $I_1$ and the current passing through the second impedor, $I_4$, is $(I_{ref}-I_1)$.

Figure 7:
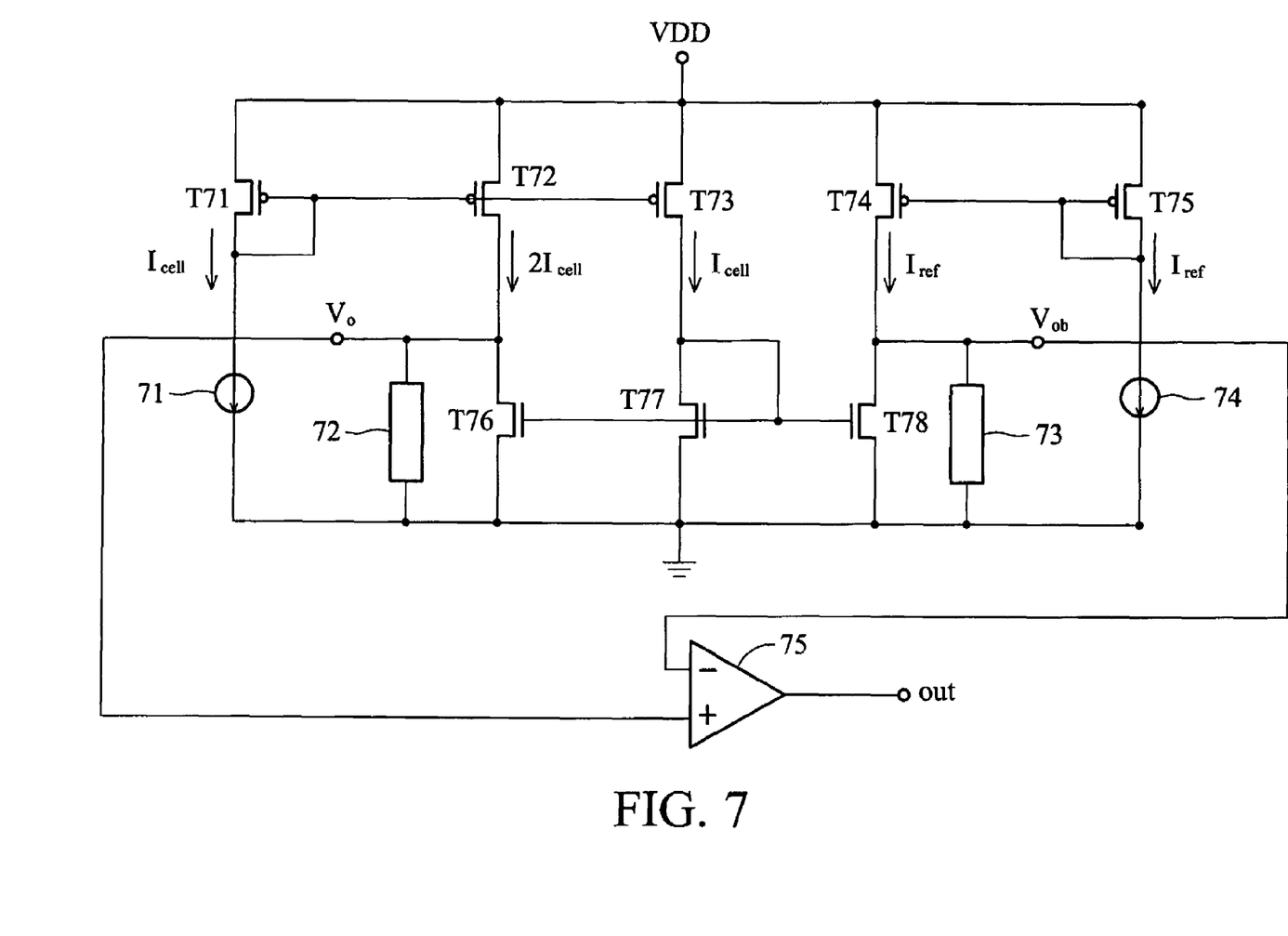
FIG. 7 is a circuit diagram of another embodiment of the sense amplifier of the invention.

FIG. 7 is a circuit diagram of another embodiment of the sense amplifier of the invention. The first source/drains of transistors T71, T72, T73, T74 and T75 are coupled to a high voltage source VDD. The gates of transistor T71 and T72 are coupled to the gate of transistor T73. The gate and the second source/drain of transistor T71 are coupled to memory cell current source 71 generating the memory cell current $I_{cell}$ by applying a predetermined voltage on a memory cell. When the data stored in the memory cell is logic 1, the current of the memory, by applying a predetermined voltage, is $I_H$ and when the data stored in the memory cell is logic 0, the current of the memory, by applying a predetermined voltage, is $I_L$. The second source/drain of transistor T72 is coupled to the first source/drain of transistor T76 and one node of first impedor 72, wherein the first impedor 72 has impedance $Z_{load}$. In FIG. 7, the W/L of transistor T72 is twice the W/L of transistor T73, thus, the current passing through the transistor T72 is twice the current passing transistor T73. The second source/drain of transistor T73 is coupled to the first source drain and the gate of transistor T77. The gate of transistor T74 is coupled to the gate and the second source/drain of transistor T75. The second source/drain of transistor T74 is coupled to the first source/drain of transistor T78 and one node of the second impedor, wherein the second impedor 73 has impedance $Z_{load}$. The second source/drain of transistor T75 is coupled to a reference current source 74 generating a reference current $I_{ref}$ by applying the predetermined voltage on a reference memory cell. In FIG. 7, the reference current $I_{ref}$ is the sum of $I_H$ and $I_L$. The second source/drain of transistors T76, T77 and T78 are connected to ground.

When the data stored in the memory cell is logic 1, the current of the memory cell is $I_H$ ($I_{cell}=I_H$) A current mirror comprising transistors T76, T77 and T78 takes the current $I_H$ passing through the transistor T77 as the reference current, thus, the current passing through the transistor T76 and the first impedor 72 is $I_H$. Transistors T74 and T75 forms a current mirror, thus, the current passing through the transistor T74 is the reference current $I_{ref}$. The current $I_{ref}$ is input to transistor T78 and the second impedor 73, and the current passing through the transistor T78 is $I_H$, thus, the current passing through the second impedor 73 is $I_L$. Comparator 75 is coupled to the first impedor 72 and the second impedor 73 and outputs a voltage $V_{out}$ based on the voltages $V_o$ and $V_{ob}$. In the present embodiment, the voltage $V_o$ is $(I_H \times Z_{load})$ and the voltage $V_{ob}$ is $(I_L \times Z_{load})$, thus, when the data stored in memory cell is logic 1, the sensing voltage range, $V_{out}$, is $(I_H-I_L) \times Z_{load}$.

When the data stored in the memory cell is logic 0, the current of the memory cell is $I_L$ ($I_{cell}=I_L$) A current mirror comprising transistors T76, T77 and T78 takes the current $I_L$ passing through the transistor T77 as the reference current, thus, the current passing through the transistor T76 and the first impedor 72 is $I_L$. Transistors T74 and T75 form a current mirror, thus, the current passing through the transistor T74 is the reference current $I_{ref}$. The current $I_{ref}$ is input to transistor T78 and the second impedor 73, and the current passing through the transistor T78 is $I_L$, thus, the current passing through the second impedor 73 is $I_H$. Comparator 75 is coupled to the first impedor 72 and the second impedor 73 and outputs a voltage $V_{out}$ based on the voltages $V_o$ and $V_{ob}$. In the present embodiment, the voltage $V_o$ is $(I_L \times Z_{load})$ and the voltage $V_{ob}$ is $(I_H \times Z_{load})$, thus, when the data stored in memory cell is logic 1, the sensing voltage range, $V_{out}$, is $(I_L-I_H) \times Z_{load}$. Compared with the sense amplifiers of FIG. 1 and FIG. 2, the sense amplifier of FIG. 7 increases the sensing voltage range and reduces the layout area.

Figure 8:
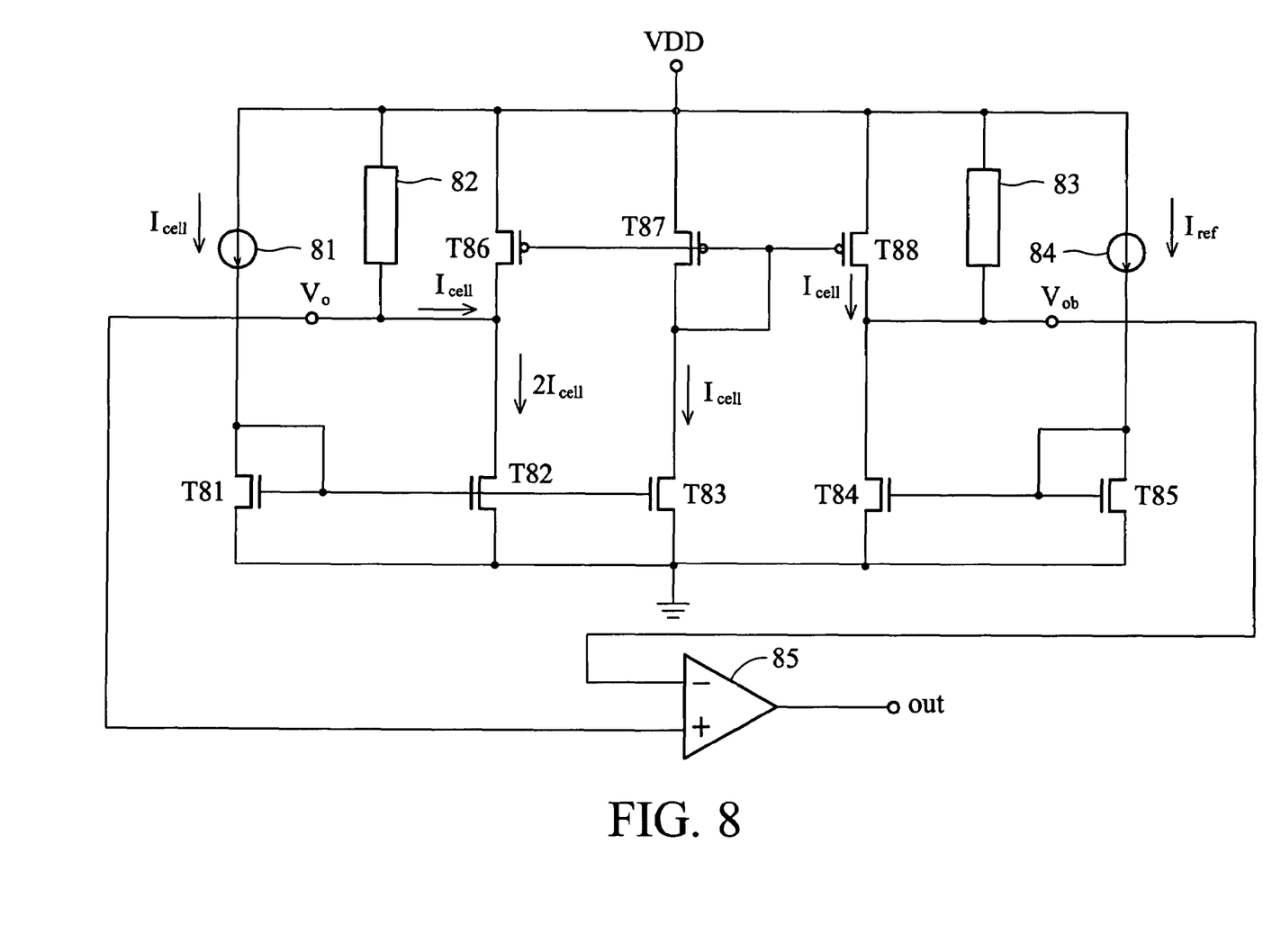
FIG. 8 is a circuit diagram of another embodiment of the sense amplifier of the invention.

FIG. 8 is a circuit diagram of another embodiment of the sense amplifier of the invention. The first source/drains of transistors T86, T87 and T88 are coupled to a high voltage source VDD, and the gate of transistor T86 is coupled to the gates of transistors T87 and T88. The second source/drain of the transistor T86 is coupled to the first source/drain of the transistor T83. The second source/drain of transistor T83 is coupled to the first source/drain of transistor T81 and the second impedor 83. Memory cell current source 81 coupled to the high voltage source VDD, the first source/drain and gate of transistor T81 generates a memory cell current $I_{cell}$ by applying a predetermined voltage on a memory cell. When the data stored in the memory cell is logic 1, the current of the memory, by applying a predetermined voltage, is $I_H$ and when the data stored in the memory cell is logic 0, the current of the memory, by applying a predetermined voltage, is $I_L$. Reference current source 84 coupled to the high voltage source VDD, the first source/drain and gate of transistor T81 generates a reference current $I_{ref}$ by applying a predetermined voltage on a reference memory cell and in this embodiment, the reference current $I_{ref}$ is the sum of $I_H$ and $I_L$. The second source/drains of transistors T81, T82, T83, T84 and T85 are coupled to ground, the gate of transistor T81 is coupled to the gates of transistor T82 and T83, and the gate of transistor T84 is coupled to the gate of transistor T85. In FIG. 8, the W/L of transistor T82 is twice the W/L of transistor T81, thus, the current passing through the transistor T82 is twice the current passing transistor T81. Furthermore, the first impedor 82 and second impedor 83 have impedance $Z_{load}$.

When the data stored in the memory cell is logic 1, the current of the memory cell is $I_H$ ($I_{cell}=I_H$). A current mirror comprising transistors T86, T87 and T88 takes the current $I_H$ passing through the transistor T87 as the reference current, thus, the current passing through the transistor T86 and the first impedor 82 is $I_H$. Transistors T84 and T85 form a current mirror, thus, the current passing through the transistor T84 is the reference current $I_{ref}$. The current $I_{ref}$ is input to transistor T88 and the second impedor 83, and the current passing through the transistor T88 is $I_H$, thus, the current passing through the second impedor 83 is $I_L$. Comparator 85 is coupled to the first impedor 82 and the second impedor 83 and outputs a voltage $V_{out}$ based on the voltages $V_o$ and $V_{ob}$. In the present embodiment, the voltage $V_o$ is $(VDD-I_H \times Z_{load})$ and the voltage $V_{ob}$ is $(VDD-I_L \times Z_{load})$, thus, when the data stored in memory cell is logic 1, the sensing voltage range, $V_{out}$, is $(I_H-I_L) \times Z_{load}$.

When the data stored in the memory cell is logic 0, the current of the memory cell is $I_L$ ($I_{cell}=I_L$) A current mirror made of transistors T86, T87 and T88 takes the current $I_L$ passing through the transistor T87 as the reference current, thus, the current passing through the transistor T86 and the first impedor 82 is $I_L$. Transistors T84 and T85 form a current mirror, thus, the current passing through the transistor T84 is the reference current $I_{ref}$. The current $I_{ref}$ is input to transistor T88 and the second impedor 83, and the current passing through the transistor T88 is $I_L$, thus, the current passing through the second impedor 83 is $I_H$. Comparator 85 is coupled to the first impedor 82 and the second impedor 83 and outputs a voltage $V_{out}$ based on the voltages $V_o$ and $V_{ob}$. In the present embodiment, the voltage $V_o$ is (VDD−$I_L×Z_{load}$) and the voltage $V_{ob}$ is (VDD−$I_H×Z_{load}$), thus, when the data stored in memory cell is logic 1, the sensing voltage range, $V_{out}$, is ($I_L−I_H)×Z_{load}$. Compared with the sense amplifiers of FIG. 1 and FIG. 2, the sense amplifier of FIG. 7 increases the sensing voltage range and reduces the layout area.

Figure 9:
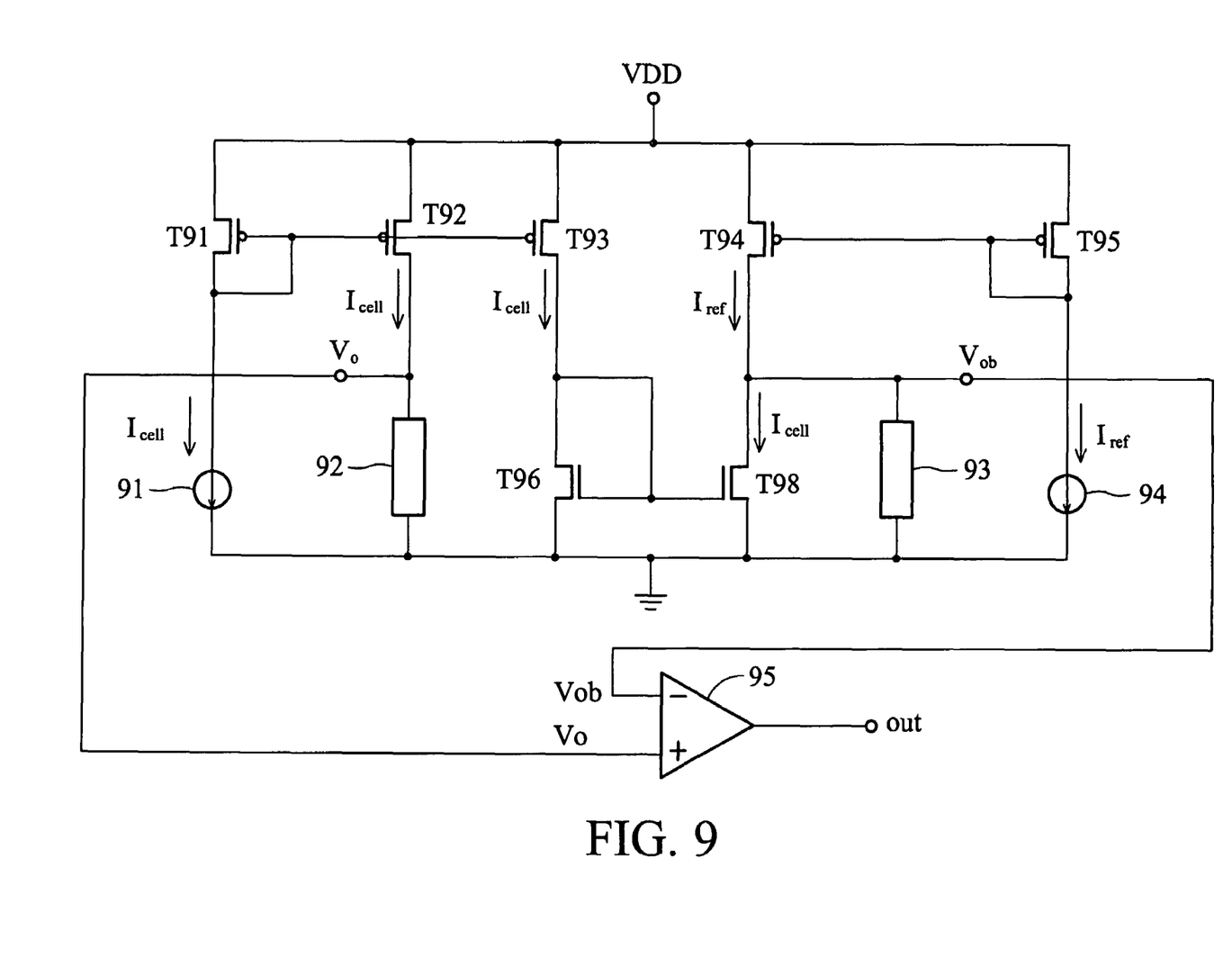
FIG. 9 is a circuit diagram of another embodiment of the sense amplifier of the invention.

FIG. 9 is a circuit diagram of another embodiment of the sense amplifier of the invention. The first source/drains of transistors T91, T92, T93, T94 and T95 are coupled to a high voltage source VDD, the gate of transistor T91 is coupled to the gates of transistors T92 and T93, and the gate of transistor T94 is coupled to the gate of transistor T95. Memory cell current source 91 coupled to the second source/drain and gate of transistor T91 generates a memory cell current $I_{cell}$ by applying a predetermined voltage on a memory cell. When the data stored in the memory cell is logic 1, the current of the memory, by applying a predetermined voltage, is $I_H$ and when the data stored in the memory cell is logic 0, the current of the memory, by applying a predetermined voltage, is $I_L$. The second source/drain of transistor T91 is coupled to the first impedor 92 and comparator 95, and the second source/drain of transistor T93 is coupled to the first source/drain of transistor T96 and the gates of transistors T96 and T98. Reference current source 94 is coupled to the second source/drain and gate of transistor T95. The second source/drain of transistor T94 is coupled to the first source/drain of transistor T98, the second impedor 93 and the comparator 95.

When the data stored in the memory cell is logic 1, the current of the memory cell is $I_H$ ($I_{cell}=I_H$). A current mirror made of transistors T91, T92 and T93 takes the current $I_H$ passing through the transistor T91 as the reference current, thus, the current passing through the transistor T96 and the first impedor 92 is $I_H$. Transistors T94 and T95 forms a current mirror, thus, the current passing through the transistor T94 is the reference current $I_{ref}$. The current $I_{ref}$ is input to transistor T98 and the second impedor 93, and the current passing through the transistor T98 is $I_H$, thus, the current passing through the second impedor 93 is $I_L$. Comparator 95 is coupled to the first impedor 92 and the second impedor 93 and outputs a voltage $V_{out}$ based on the voltages $V_o$ and $V_{ob}$. In the present embodiment, the voltage $V_o$ is ($I_L×Z_{load}$) and the voltage $V_{ob}$ is ($I_H×Z_{load}$), thus, when the data stored in memory cell is logic 1, the sensing voltage range, $V_{out}$, is ($I_H−I_L)×Z_{load}$.

When the data stored in the memory cell is logic 0, the current of the memory cell is $I_L$ ($I_{cell}=I_L$). A current mirror comprising transistors T91, T92 and T93 takes the current $I_L$ passing through the transistor T91 as the reference current, thus, the current passing through the transistor T96 and the first impedor 92 is $I_L$. Transistors T94 and T95 forms a current mirror, thus, the current passing through the transistor T94 is the reference current $I_{ref}$. The current $I_{ref}$ is input to transistor T98 and the second impedor 93 and the current passing through the transistor T98 is $I_L$, thus, the current passing through the second impedor 93 is $I_H$. Comparator 95 is coupled to the first impedor 92 and the second impedor 93 and outputs a voltage $V_{out}$ based on the voltages $V_o$ and $V_{ob}$. In the present embodiment, the voltage $V_o$ is ($I_H×Z_{load}$) and the voltage $V_{ob}$ is ($I_L×Z_{load}$), thus, when the data stored in the memory cell is logic 1, the sensing voltage range, $V_{out}$, is ($I_L−I_H)×Z_{load}$. Compared with the sense amplifiers of FIG. 1 and FIG. 2, the sense amplifier of FIG. 9 increases the sensing voltage range and reduces the layout area.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A sense amplifier coupled to a memory cell, comprising:
a first current mirror unit coupled to a high voltage source outputting a first current via a first output and a second current via a second output based on a first reference current, wherein the first current is equal to the first reference current and the second current is two times the first current;
a second current mirror unit coupled to the high voltage source outputting a reference current via a third output based on a second reference current, wherein the reference current is equal to the second reference current;
a first impedor coupled to the second output and a low voltage source, having a first impedance;
a second impedor coupled to the third output and the low voltage source having the first impedance;
a third current mirror unit coupled to the first output, the second output and the third output, taking the first current as a third reference current of the third current mirror to make the current passing through the first impedor equal to the first current and the current passing through the second impedor equal to a fourth current.

2. The sense amplifier as claimed in claim 1, further comprising a comparator having a output and two inputs, wherein one input is coupled to the second output, another input is coupled to the third output and a voltage is output via the output.

3. The sense amplifier as claimed in claim 2, wherein the voltage is a product of the first impedance and a difference between the first current and the reference current.

4. The sense amplifier as claimed in claim 1, wherein when the memory cell stores a data of logic state 1, the first current is a logic high current, and when the memory cell stores a data of logic state 0, the first current is a logic low current.

5. The sense amplifier as claimed in claim 4, wherein the reference current is the sum of the logic high current and the logic low current.

6. The sense amplifier as claimed in claim 1, wherein the first current mirror unit comprises:
a memory cell current source coupled to the low voltage source for providing the first current;
a first transistor having a first source, a first drain and a first gate, wherein the first source is coupled to the high voltage source, the first drain and the first gate are coupled to the memory cell current source;
a second transistor having a second source, a second drain and a second gate, wherein the second source is coupled to the high voltage source, the second gate is coupled to the first gate and the second drain is coupled to the first impedor and the third current unit; and
a third transistor having a third source, a third drain and a third gate, wherein the third source is coupled to the high voltage source, the third gate is coupled to the first gate and the third drain is coupled to the third current unit.

7. The sense amplifier as claimed in claim 6, wherein a W/L value of the second transistor is twice large as a W/L value of the first transistor.

8. The sense amplifier as claimed in claim 1, wherein the second current mirror unit comprises:
 a reference memory cell current source coupled to the low voltage source for providing the reference current;
 a fourth transistor having a fourth source, a fourth drain and a fourth gate, wherein the fourth source is coupled to the high voltage source, the fourth drain is coupled to the third current mirror unit and the second impedor; and
 a fifth transistor having a fifth source, a fifth drain and a fifth gate, wherein the fifth source is coupled to the high voltage source, the fifth gate is coupled the fourth gate and the fifth drain and the fifth drain is coupled to the reference memory cell current source.

9. The sense amplifier as claimed in claim 1, wherein the third current mirror unit comprises:
 a sixth transistor having a sixth source, a sixth drain and a sixth gate, wherein the sixth source is coupled to the low voltage source and the sixth drain is coupled to the first impedor and the first current mirror unit;
 a seventh transistor having a seventh source, a seventh drain and a seventh gate, wherein the seventh source is coupled to the low voltage source and the seventh drain is coupled to the sixth gate, the seventh gate and the first current mirror unit; and
 an eighth transistor having an eighth source, an eighth drain and an eighth gate, wherein the eighth source is coupled to the low voltage source, the eighth gate is coupled to the seventh gate and the eighth drain is coupled to the second impedor and the second current mirror unit.

10. The sense amplifier as claimed in claim 1, wherein the first impedor is a resistor, a capacitor, an inductor or a combination thereof.

11. The sense amplifier as claimed in claim 1, wherein the first impedor is an active resistor.

12. The sense amplifier as claimed in claim 1, wherein the second impedor is a resistor, a capacitor, an inductor or a combination thereof.

13. The sense amplifier as claimed in claim 1, wherein the second impedor is an active resistor.

14. The sense amplifier as claimed in claim 1, wherein the third current is the sum of the first current and the fourth current.

15. A sense amplifier coupled to a memory cell, comprising:
 a first impedor coupled to a low voltage source;
 a second impedor coupled to the low voltage source;
 a memory cell current source coupled to the low voltage source for providing a first current;
 a reference memory cell current source coupled to the low voltage source for providing a reference current;
 a first transistor having a first source, a first drain and a first gate, wherein the first source is coupled to the high voltage source, the first drain and the first gate are coupled to the memory cell current source;
 a second transistor having a second source, a second drain and a second gate, wherein the second source is coupled to a high voltage source, the second gate is coupled to the first gate and the second drain is coupled to the first impedor;
 a third transistor having a third source, a third drain and a third gate, wherein the third source is coupled to the high voltage source and the third gate is coupled to the first gate;
 a fourth transistor having a fourth source, a fourth drain and a fourth gate, wherein the fourth source is coupled to the high voltage source and the fourth drain is coupled to the second impedor;
 a fifth transistor having a fifth source, a fifth drain and a fifth gate, wherein the fifth source is coupled to the high voltage source, the fifth gate is coupled the fourth gate and the fifth drain and the fifth drain is coupled to the reference memory cell current source;
 a sixth transistor having a sixth source, a sixth drain and a sixth gate, wherein the sixth source is coupled to the low voltage source and the sixth drain is coupled to the first impedor and the second drain;
 a seventh transistor having a seventh source, a seventh drain and a seventh gate, wherein the seventh source is coupled to the low voltage source and the seventh drain is coupled to the third drain, the seventh gate and the sixth gate; and
 an eighth transistor having an eighth source, an eighth drain and an eighth gate, wherein the eighth source is coupled to the low voltage source, the eighth gate is coupled to the seventh gate and the eighth drain is coupled to the second impedor and the fourth drain.

16. The sense amplifier as claimed in claim 15, wherein the first transistor, the second transistor, the third transistor, the fourth transistor and the fifth transistor are PMOS transistors.

17. The sense amplifier as claimed in claim 15, wherein the sixth transistor, the seventh transistor and the eighth transistor are NMOS transistors.

18. The sense amplifier as claimed in claim 15, further comprising a comparator having an output and two inputs, wherein one input is coupled to the second impedor and the fourth drain, another input is coupled to the first impedor and the second drain, and the output outputting a voltage difference between the first impedor and the second impedor.

19. The sense amplifier as claimed in claim 15, wherein the first impedor and the second impedor have a first impedance and the voltage difference is the product of the first impedance and the difference between the first current and the reference current.

20. The sense amplifier as claimed in claim 15, wherein a W/L value of the second transistor is twice large as a W/L value of the first transistor.

21. The sense amplifier as claimed in claim 15, wherein the first impedor is a resistor, a capacitor, an inductor or a combination thereof.

22. The sense amplifier as claimed in claim 15, wherein the first impedor is an active resistor.

23. The sense amplifier as claimed in claim 15, wherein the second impedor is a resistor, a capacitor, an inductor or a combination thereof.

24. The sense amplifier as claimed in claim 15, wherein the second impedor is an active resistor.

* * * * *